United States Patent
Schulz et al.

(10) Patent No.: US 8,649,004 B2
(45) Date of Patent: Feb. 11, 2014

(54) LIGHT SENSOR AND LIGHTING DEVICE WITH ADAPTABLE COLOR

(75) Inventors: Volkmar Schulz, Wuerselen (DE); Christoph Martiny, Aachen (DE); Eduard Johannes Meijer, Eindhoven (NL); Peter Vergeer, Veldhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 689 days.

(21) Appl. No.: 12/672,310

(22) PCT Filed: Aug. 11, 2008

(86) PCT No.: PCT/IB2008/053208
§ 371 (c)(1), (2), (4) Date: Jan. 24, 2011

(87) PCT Pub. No.: WO2009/022282
PCT Pub. Date: Feb. 19, 2009

(65) Prior Publication Data
US 2011/0109232 A1    May 12, 2011

(30) Foreign Application Priority Data

Aug. 13, 2007   (EP) .................................... 07114247

(51) Int. Cl.
*G01B 11/26*   (2006.01)
*G01N 21/00*   (2006.01)

(52) U.S. Cl.
USPC .................................. 356/139.07; 356/239.2

(58) Field of Classification Search
USPC .................. 315/290, 291, 257; 356/416–419, 356/239.1–239.2, 239.5, 239.8, 445–446, 356/328
See application file for complete search history.

(56) References Cited

U.S. PATENT DOCUMENTS

| | | | |
|---|---|---|---|
| 2003/0030808 A1 * | 2/2003 | Marshall et al. | 356/406 |
| 2006/0146330 A1 | 7/2006 | Maniam | |
| 2007/0183040 A1 * | 8/2007 | Sinyugin et al. | 359/515 |

FOREIGN PATENT DOCUMENTS

| | | | |
|---|---|---|---|
| JP | 07063679 A | | 3/1995 |
| WO | 02099333 A1 | | 12/2002 |
| WO | 2004017054 A1 | | 2/2004 |
| WO | WO 2004017054 A1 * | | 2/2004 |
| WO | WO 2004111907 A2 * | | 12/2004 |
| WO | 2007000699 A1 | | 1/2007 |

OTHER PUBLICATIONS

Odom et al: "Improved Pattern Transfer in Soft Lithography Using Composite Stamps"; Langmuir 2002, vol. 18, pp. 5314-5320.

* cited by examiner

*Primary Examiner* — Minh D A

(57) ABSTRACT

Light sensors (1) are used in lighting applications, especially in combination with LEDs, to control and/or adapt the color point of light sources. Costs and/or performance of the light sensor (1) are essential in order to guarantee cost-effective light sources with reproducible color points. This aim is achieved by a light sensor (1) comprising a light diffuser (10), an optical non-transparent housing (11) having at least one window (12), at least one interference filter (13) and at least two photo sensors (14). The light diffuser (10) is arranged in such a way that light from outside the optical non-transparent housing (11) has to pass the light diffuser (10) so as to enter the interior of the optical non-transparent housing (11) via the window (12). The interference filter (13) and the at least two photo sensors (14) are arranged in the interior of the optical non-transparent housing (11), which interference filter (13) is arranged between the window (12) and the at least two photo sensors (14).

7 Claims, 6 Drawing Sheets

LIGHT SENSOR AND LIGHTING DEVICE WITH ADAPTABLE COLOR

FIELD OF THE INVENTION

The present invention relates to a light sensor, a lighting device with adaptable color comprising such a light sensor and a method of controlling such a lighting device.

BACKGROUND OF THE INVENTION

A white light-emitting LED luminary is described in WO 02/099333 A1. The LED luminary incorporates an array of red, green and blue emitting LEDs and a feedback arrangement for maintaining a desired color balance. The feedback arrangement includes photodiodes positioned and enabled to separately measure the light output of each RGB color component. In one embodiment, a single photodiode or array of photodiodes is positioned to intercept reflected light from a partially reflecting element placed in the path of the combined output of the LED array. Individual colors are measured sequentially by pulsing the LEDs and photodiodes or by the use of color filters. Interference filters are normally used for high accurate color control. The angle dependency of the transmission wavelength of interference filters may cause problems during operation.

OBJECT AND SUMMARY OF THE INVENTION

It is an object of the invention to provide an improved and cost-effective light sensor.

It is a further object of the invention to provide a lighting device with such an improved and cost-effective light sensor.

It is another object of the invention to provide a method of controlling a lighting device.

One object of the present invention is achieved by a light sensor comprising a light diffuser, an optical non-transparent housing having at least one window, at least one interference filter and at least two photo sensors, the light diffuser being arranged in such a way that light from outside the optical non-transparent housing has to pass the light diffuser so as to enter the interior of the optical non-transparent housing via the window, the interference filter and the at least two photo sensors being arranged in the interior of the optical non-transparent housing, said interference filter being arranged between the window and the at least two photo sensors.

The combination of the optical diffuser and the window results in an approximately Lambertian radiator with a Lambertian ray pattern according to Lambert's cosine law with respect to the surface of the interference filter. The window preferably has a smaller width than the photo sensor. More preferably, the width of the window is smaller than $^{1}/_{10}$ of the width of the photo sensor. The optical diffuser can be arranged anywhere between a light source emitting light to be detected by the light sensor and the window. In addition, the inner surface of the optical non-transparent housing should be light-absorbing, e.g. by roughening the surface or by providing a light-absorbing layer reducing the reflected light in a sufficient way to minimize signal noise due to reflected light in the interior of the non-transparent housing. The Lambertian ray pattern is used in combination with the interference filter or interference filters and the photo sensors, such as, for example, photodiodes for detecting the emission characteristics and especially the color characteristics of incident light. The color characteristics of the incident light are determined e.g. by detecting the relative intensity of the light passing through the window in at least two different wavelength ranges.

In one embodiment of a light sensor according to the invention, the light sensor comprises an optical non-transparent housing with one interference filter. In combination with the angular dependence of the transmission wavelength of the interference filter, the Lambertian ray pattern is used to detect the relative intensity of the light passing through the window in at least two different wavelength ranges. The interference filter is preferably attached to the photo sensors. Taking a circular hole as a window, the first photo sensor preferably has an essentially circular shape and receives light from the circular hole emitted at certain solid angles corresponding to a first transmission band of the interference filter and the second photo sensor having an essentially annular shape circumventing the first photo sensor. The second photo sensor receives light from the circular hole emitted at different solid angles corresponding to a second optical transmission band of the interference filter. A spacer can be arranged between the first and the second photo sensor in order to improve the separation between the optical transmission bands. This configuration has the advantage that only one interference filter is needed, which reduces the costs of the light sensor. The circularly symmetrical arrangement of the photo sensors allows receiving a maximum signal strength. Other arrangements are possible, such as patches of photo sensors covering defined ranges of angles of incidence with respect to the normal of the layer defined by the surface of the interference filter.

In a further embodiment of a light sensor according to the invention, the light sensor comprises an optical non-transparent housing having at least two windows, at least two lenses and at least two interference filters, the windows and lenses being arranged as collimators in the optical non-transparent housing and the at least two interference filters having a maximum transmission at different wavelength ranges. The windows are preferably circularly shaped holes, with each hole being arranged in the focal point of a lens. Diffuse light passing through one of the holes has to pass through the corresponding lens and reaches the corresponding interference filter as a parallel beam. Only light of a certain wavelength range depending on the interference filter passes the interference filter, which results in a precise measurement of the intensity of light in a rather narrow wavelength range by means of the corresponding photo sensor. The parallel beam of light prevents broadening of the transmission wavelength range of the interference filter due to light at different angles of incidence. The lens used in this arrangement may comprise a first material having a refractive index n1 and a second material having a refractive index n2, in which n2 is larger than n1, the first material being arranged as a plane-parallel plate with at least two recesses perpendicular to the plane-parallel plate of the first material, the recesses being filled with the second material. The recesses preferably but not necessarily have a circularly symmetric cross-section parallel to the plate of the first material. The shape of the cross-section of the recesses perpendicular to the plate of the first material is arranged in such a way that the focal point of the lens formed by the combined structure of the second material filled in the recesses in combination with the plate of the first material is at the location where the windows (for example, circularly shaped holes) are arranged.

Another object of the present invention is achieved by a lighting device comprising a light sensor as described above, a light source with adaptable color and control electronics, the at least two photo sensors of the light sensor being designed to supply an electric control signal after detecting light passing the at least one interference filter, the control electronics being designed to adapt the color of the light source on the basis of the electric control signal detected by the photo sensors.

The color of the light source is e.g. determined by detecting the relative intensity of the light passing through the window in at least two different wavelength ranges. The light source may be either a single light emitter with a controllable color of the emitted light or an array of light emitters with either a controllable color of the emitted light or at least two light emitters emitting light in different colors. The inner surface of the optical non-transparent housing of the light sensor should be light-absorbing, e.g. by roughening the surface or by providing a light-absorbing layer reducing the reflected light in a sufficient way so as to minimize signal noise due to reflected light in the interior of the non-transparent housing. Depending on the amount of light passing through the window, the signal strength can be reduced by adapting the size of the window and/or the size of the photo sensors, or it can be enhanced by using an array of windows wherein each window has dedicated photo sensors as described above. The windows and the dedicated photo sensors may be arranged in optically separated cells within the interior of the optical non-transparent housing, wherein "optically separated" is understood to mean that light entering the interior of the optical non-transparent housing via one window is only detected by the dedicated photo sensors. Alternatively, a plurality of light sensors may be used in one lighting device. The control electronics may comprise means such as a processor with storage means and adapted software, or an ASIC to analyze the detected data of the different cells or photo sensors in order to reduce measurement errors.

In another embodiment of a lighting device according to the invention, LEDs are used as light sources. The LEDs have different colors such as e.g. red and blue. The intensity of each LED can be individually controlled by means of the control electronics in accordance with the control signals detected by the photo sensors. Control of the intensity of the LEDs allows spanning a sub-space of color space by means of the linear combination of the light emitted by the LEDs. Further well-known combinations of LEDs that can be used are, for example, the combination of a red, green and blue (RGB) LED or a red, green, blue and amber LED. In general, control of the light source can be used to change the color of the lighting device and/or to compensate changes of colors of the lighting device due to internal and external factors. Internal and external factors are, for example, temperature, the electric current driving the LED and aging being especially but not exclusively relevant for LEDs.

In a further embodiment of a lighting device according to the invention, the light source comprises at least two LEDs and a luminescence converter. The luminescence converter may be a phosphor powder distributed in a silicon or epoxy resin matrix, wherein "phosphor powder" is understood to mean one or more phosphor materials converting light of a first wavelength, which may be emitted by the light source, to light of a second wavelength. Special types of luminescence converters are monolithic luminescence converters such as ceramic luminescence converters as disclosed in WO 2006/087660, herein incorporated by reference, or glass with dissolved phosphor particles. The luminescence converter is at least partly used as a diffuser and/or optical light guide. In a special embodiment, the luminescence converter is a monolithic luminescence converter plate with at least one recess, the light sensor being placed in the recess and the window being in contact with the monolithic luminescence converter. Contact between the monolithic luminescence converter and the window may be either direct or indirect, wherein "direct" is understood to mean that there is no intermediate layer between the monolithic luminescence converter and the window, and "indirect" is understood to mean that there is an intermediate layer between the monolithic luminescence converter and the window. The intermediate layer may be, for example, an antireflection layer or an optical matching layer decreasing the probability of total reflection at the surface of the monolithic luminescence converter facing the window of the light sensor. The LEDs may also be in direct or indirect contact with the monolithic luminescence converter emitting light in this converter. The wavelength of at least a part of the light entering the monolithic luminescence converter is converted to a different wavelength. Furthermore, the light is scattered at the grain boundaries of the ceramic material if the monolithic luminescence converter is a monolithic ceramic luminescence converter working as an optical diffuser. In addition, the light within the monolithic luminescence converter is reflected at its surface due to the higher refractive index of the monolithic luminescence converter in comparison with air guiding the light to the location where the window of the light sensor is in contact with the monolithic luminescence converter. The part of the monolithic luminescence converter where the light sensor is placed can be covered with a reflective layer or coating. The reflective layer or coating can be used to shield the light sensor from ambient light and to enhance the amount of light that can enter the light sensor via the window.

The lighting device according to the present invention may be used in one or more of the following applications:
Office-lighting systems,
Household application systems,
Shop-lighting systems,
Home-lighting systems,
Accent-lighting systems,
Spot-lighting systems,
Theater-lighting systems,
Fiber-optics application systems,
Projection systems,
Self-lit display systems,
Pixelated display systems,
Segmented display systems,
Warning-sign systems,
Medical lighting application systems,
Indicator-sign systems,
Decorative lighting systems,
Portable systems,
Automotive applications,
Greenhouse lighting systems.

A further object of the invention is achieved by means of a method of controlling a lighting device, the method comprising the steps of:
providing light having a Lambertian ray pattern;
detecting the intensity of the light in at least two wavelength ranges by using the optical characteristics of the Lambertian ray pattern;
supplying electric control signals based on the detected intensities, and
controlling the lighting device by means of the electric control signals.

Diffusing light of a light source by means of a diffuser and providing a window in an optically non-transparent housing may provide the Lambertian ray pattern of the light. Providing photo sensors in combination with at least one interference filter arranged between the window in the optically non-transparent housing and the photo sensors may be used to detect the relative intensity of the light source in at least two wavelength ranges by using the optical characteristics of the Lambertian ray pattern. The electric control signals may be supplied by means of the photo sensors.

BRIEF DESCRIPTION OF THE DRAWINGS

The present invention will be explained in greater detail with reference to the Figures, in which the same reference signs indicate similar parts, and in which.

DESCRIPTION OF EMBODIMENTS

Figure 1:
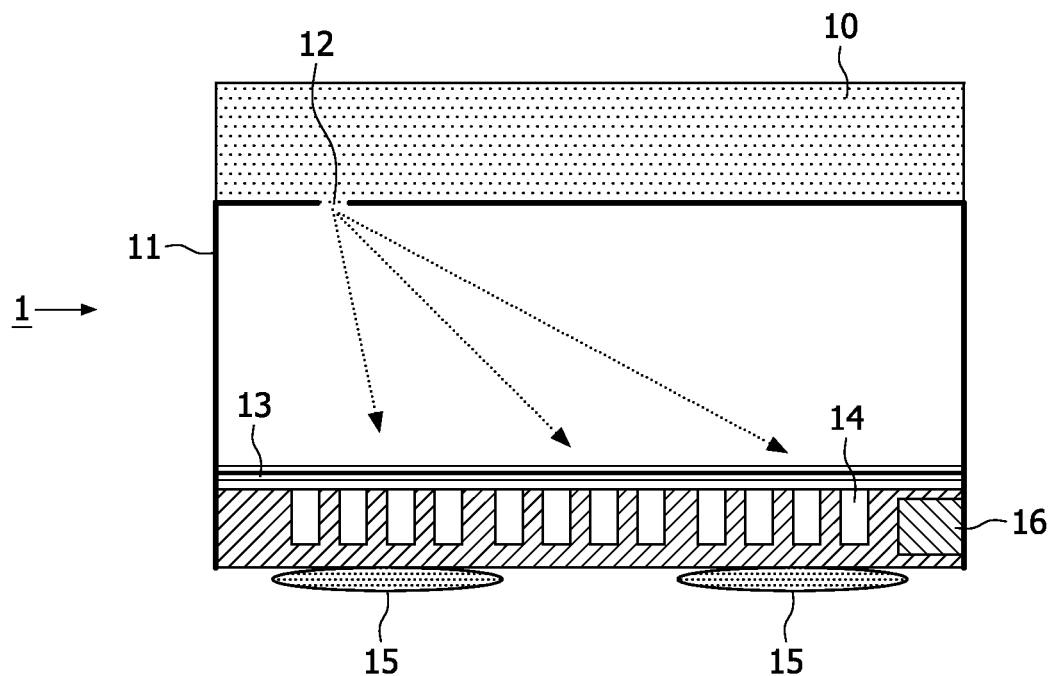
FIG. 1 is a principal sketch of a cross-section of a light sensor in accordance with a first embodiment of the invention.
Figure 2:
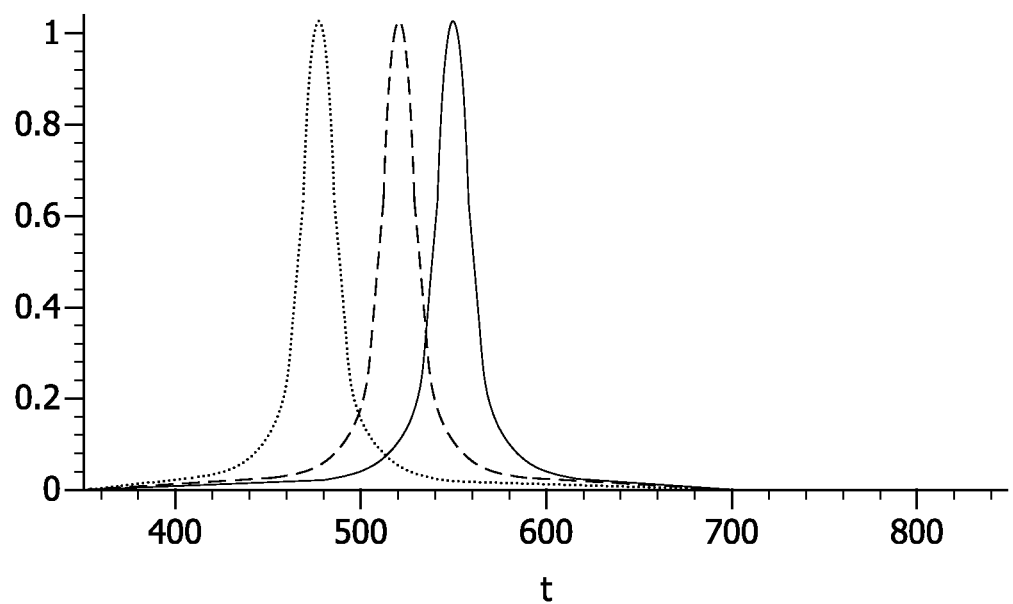
FIG. 2 shows the transmission wavelength of an interference filter at different angles of incidence of the incident light.

FIG. 1 is a principal sketch of a cross-section of a light sensor 1 in accordance with a first embodiment of the invention. The optical non-transparent housing 11 has e.g. the form of a rectangular solid in which a window 12 is provided. The window 12 is, for example, a pinhole. On the side opposite to the window 12, the optical non-transparent housing 11 incorporates an interference filter 13, for example, a Fabry-Perot Filter (FPF) covering a plurality of photo sensors 14 which are connected to control electronics 16, for example, a processor integrated in the light sensor 1. The electric contacts for power supply and signal transmission are made by means of solder balls 15 provided at the lower surface of the optical non-transparent housing. Outside the optical non-transparent housing, a light diffuser 10 is provided, which covers the window 12. The light diffuser 10, for example, a glass matrix having a large number of light-scattering particles scatters light so that diffuse light passes through the window 12 and enters the interior of the optical non-transparent housing 11, which results in a Lambertian ray pattern in the interior of the optical non-transparent housing 11. This ray pattern will transmit through an optical non-diffuse material, e.g. glass or air. The distance between the window 12 and the interference filter 13 thus enlarges the spot of the window 12 on the interference filter 13. Depending on the angle of incidence, light of a certain wavelength range passes the interference filter 13 as principally depicted in FIG. 2, which shows that the filter response shifts to the lower wavelength the more the ray is tilted against the vertical ray with respect to the surface of the interference filter. Consequently, the wavelength range of light being detected by one of the photo sensors 14 (provided that the photo sensors are broadband optical receivers) depends on the interference filter 13 (transmission wavelength at a defined angle of incidence), the geometrical arrangement of the window 12, the photo sensor 14 and the shape and extension of the photo sensor 14 itself. The electric signals resulting from the detection of the transmitted light by means of the photo sensors 14 are processed by means of the control electronics which are integrated in this case, taking e.g. into account the interference filter 13 (transmission wavelength at a defined angle of incidence of 90° with respect to the plane defined by the surface of the interference filter 13), the geometrical arrangement of the window 12, the photo sensor 14 and the shape and extension of the photo sensor 14 itself. At least two photo sensors 14 are required to detect signals in at least two wavelength ranges.

Figure 3:
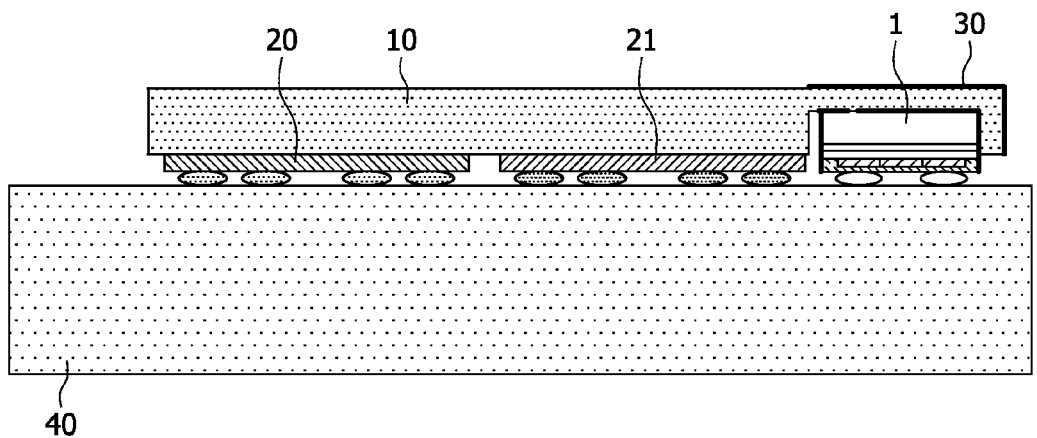
FIG. 3 is a principal sketch of a cross-section of a lighting device with a light sensor in accordance with a second embodiment of the invention.
Figure 4:
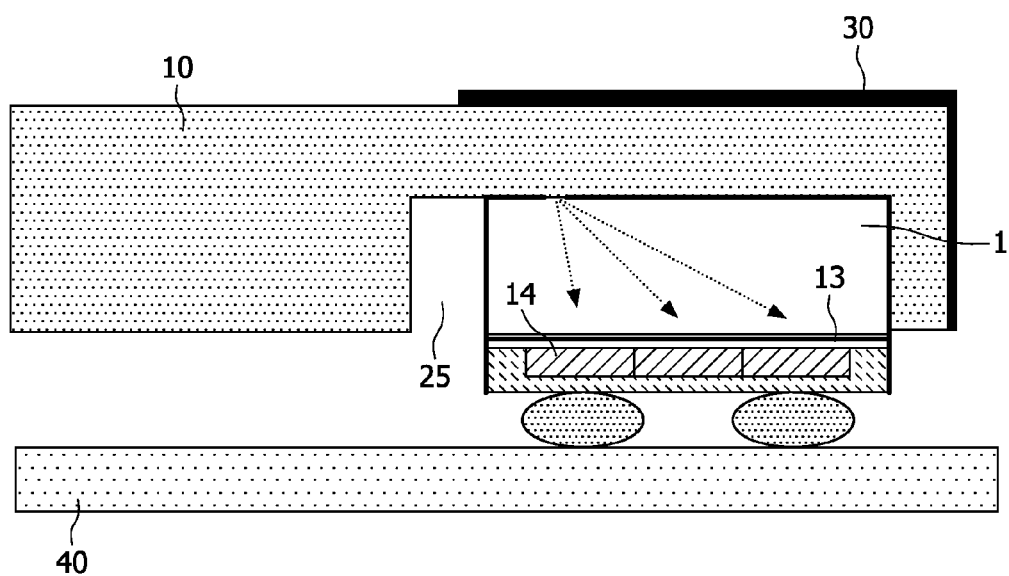
FIG. 4 is a zoomed picture of the embodiment of the device shown in FIG. 3.

FIGS. 3 and 4 are principal sketches of a cross-section of a lighting device with a light sensor in accordance with a second embodiment of the invention, wherein the light sensor 1 in FIG. 4 is shown in a zoomed view. The lighting device comprises a light source comprising a green LED 20 and a blue LED 21. The LEDs 20, 21 and the light sensor 1 are soldered to a substrate 40 having conductive paths for connecting the LEDs 20, 21 with the light sensor 1, a power supply (not shown) and/or external control electronics (not shown). The light diffuser 10 is a monolithic luminescence converter adapted to convert a part of the blue light passing through the monolithic luminescence converter to red light. Besides this conversion function, the monolithic luminescence converter is used as light diffuser 10 mixing the colors of the light emitted by the LEDs 20, 21. One side of the monolithic luminescence converter is attached to the LEDs 20, 21 by means of a transparent glue. The light sensor 1 is placed in a recess 25 of the monolithic luminescence converter provided on the side to which the LEDs 20, 21 are attached (whether a recess or a kind of optical coupling structure is needed depends on the height of the light sensor 1 in comparison with the height of the LEDs 20, 21). Furthermore, the side of the light sensor 1 with the window 12 is attached to the monolithic luminescence converter. The LEDs 20, 21 emit light in the monolithic luminescence converter. The monolithic luminescence converter mixes and converts the incident light. A part of the mixed and converted light is guided to the window 12 and diffuse light passes through the window 12 and enters the interior of the optical non-transparent housing 11 having a Lambertian ray pattern. This ray pattern will transmit through an optical non-diffuse material, e.g. glass or air. Depending on the angle of incidence, light of a certain wavelength range passes the interference filter 13 as described above with reference to FIG. 1. The electric signals resulting from the detection of the transmitted light by means of the photo sensors 14 are processed by the control electronics (not shown), which are external in this case, taking e.g. into account the interference filter 13 (transmission wavelength at a defined angle of incidence), the geometrical arrangement of the window 12, the photo sensors 14 and the shape and extension of the photo sensors 14 themselves. In this embodiment, the detected signals of three photo sensors 14 having a semi-circular shape, with the first photo sensor in the center, the second semi-circular photo sensor with a semi-circular notch arranged around the first photo sensor, and the third semi-circular photo sensor with a semi-circular notch arranged around the second photo sensor, are transmitted to the control electronics. The window 12 is a pinhole position above the center of the first photo sensor. The electronic control signals transmitted from the photo sensors are used to calculate the characteristics of the light emitted by the lighting device, such as the relative intensity of the different colors, and, if necessary, re-adjust the LEDs 20, 21 by, for example, decreasing or increasing the current supplied to each LED 20, 21.

Figure 5:
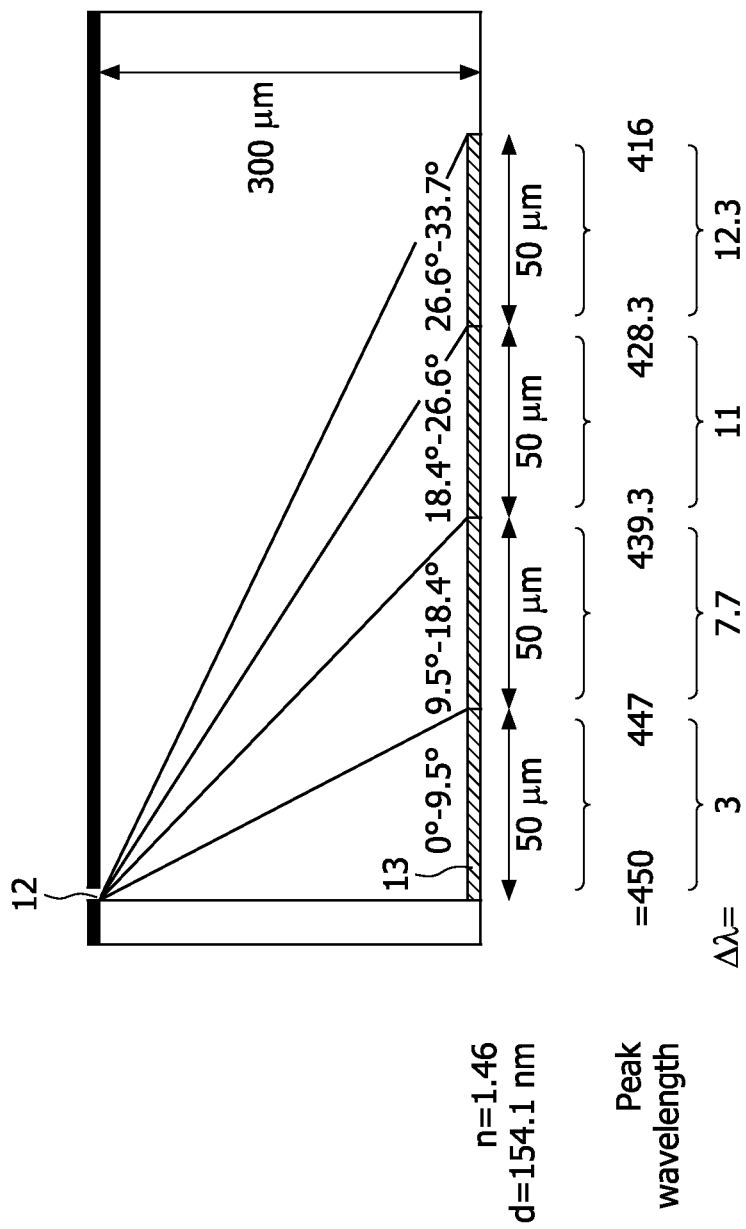
FIG. 5 is a principal sketch of the wavelength resolution of a light sensor in accordance with one embodiment of the invention.

FIG. 5 shows the angular distribution of incident light indicated by the arrows at the surface of an interference filter after passing through a window 12 (a pinhole) in one sectional plane perpendicular to the plane of the interference filter 13.

The interference filter is placed at a distance of 300 μm from the pinhole and is characterized by the refractive index n of the dielectric spacer of the filter, which has a thickness d. This dielectric spacer may consist of any material, provided that it is optically transparent in the wavelength range of interest for the application. In the visible wavelength range, it may be, for example, $SiO_2$, or silicon nitride, or air, etc. The dielectric spacer is sandwiched between two partially transmitting mirrors, which may be, for example, a thin silver or aluminum layer or a dielectric λ/4 reflector stack. The wavelength ranges transmitted at the different angles of incidence are depicted below the interference filter 13.

Figure 6:
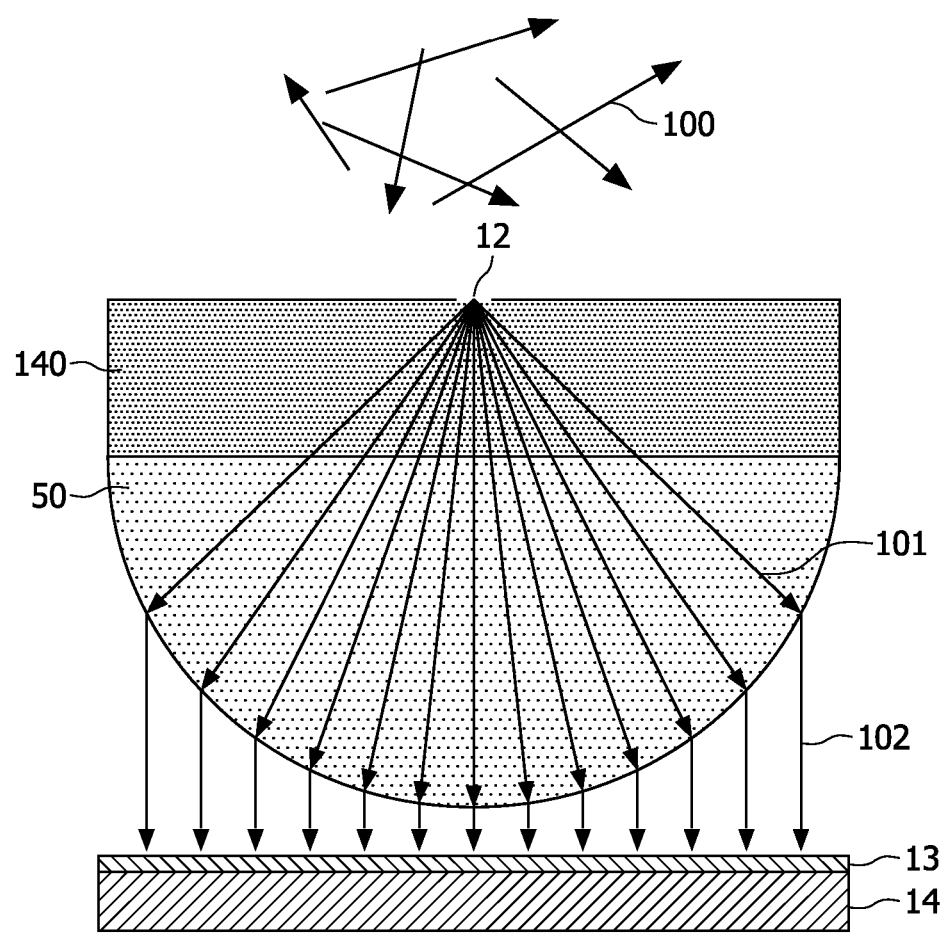
FIG. 6 is a principal sketch of a cross-section of part of a light sensor with a collimator in accordance with another embodiment of the invention.
Figure 7A:
FIG. 7 shows the process steps of a method of manufacturing the collimator shown in FIG. 6.
Figure 7B:
Figure 7C:
Figure 7D:
Figure 7E:
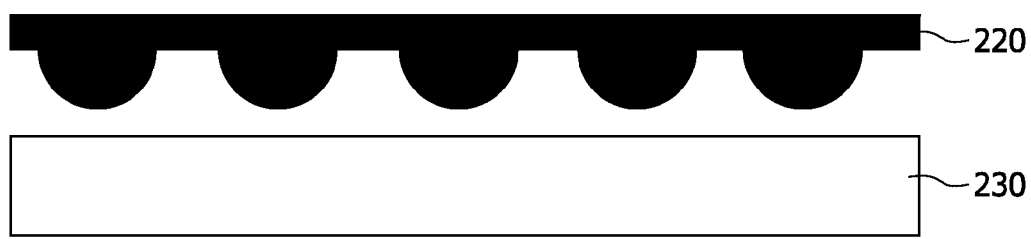
Figure 7F:
Figure 7G:
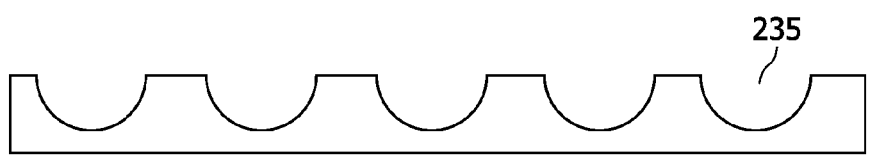
Figure 7H:
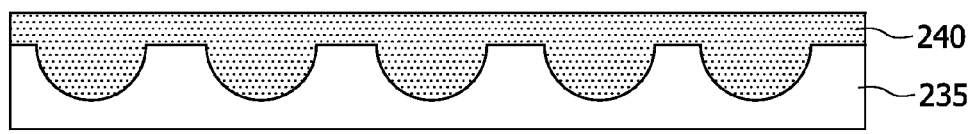
Figure 7I:
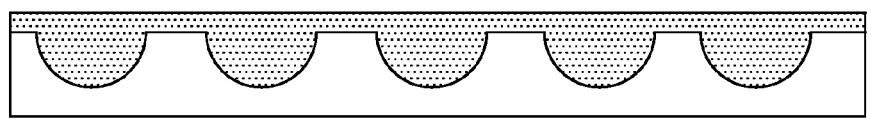
Figure 7J:
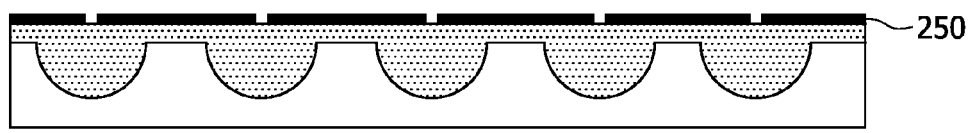

FIG. 6 is a principal sketch of a cross-section of part of a light sensor with a collimator in accordance with another embodiment of the invention. The collimator has a pinhole 12 which is optically coupled to a lens 50, which is chosen in such a way that the focal length of this lens 50 coincides with the pinhole 12. In the case of a hemispherical lens 50, this can be arranged by means of a spacer layer 140 between the lens 50 and the pinhole 12. The diffuse light 100 entering the pinhole 12 will exit the pinhole in a Lambertian ray pattern. The light rays 101 then originate from the focal point of the lens and are refracted into a collimated parallel light beam 102. The interference filter 13 is arranged perpendicularly to the collimated light beam, resulting in a narrow-band light signal transmitted through the interference filter 13 and being detected by the photo sensor 14. A combination of two or more of such arrangements as depicted in FIG. 6 with interference filters transmitting light in different wavelength ranges allows construction of rather precise light sensors, which may be used, for example, in lighting devices.

The process steps for manufacturing a similar collimator structure as shown in FIG. 6 are depicted in FIG. 7. In step A, a hole pattern is defined in an etch mask 200 covering a substrate 210. In step B, an isotropic wet etch is performed, resulting in hemispheric cavities 215 in the substrate 210. In step C, the etch mask is removed from the substrate 210. In step D, the cavities 215 are replicated by using the well-known PDMS replication process as described, for example, in Teri W. Odom, J. Christopher Love, Daniel B. Wolfe, Kateri E. Paul, and George M. Whitesides "Improved pattern transfer in soft lithography using composite stamps", Langmuir 2002, 18, 5314-5320, resulting in a rubber stamp 220 of the inverse structure after removal of the substrate 210. The stamp 220 is removed and subsequently used to mold the lens structures in a suitable sheet of optical material 230, e.g. sol-gel material or e.g. BCB as depicted in step F. The resulting molded optical material 230 is, for example, a sheet with hemispheric molds 235 as shown in step G. In the subsequent step H, the molds 235 are filled with a material 240 having a refractive index which is larger than the refractive index of the molded optical material 230. In step I, the layer of material 240 is planarized by means of chemical mechanical polishing (CMP) until the focal points of the hemispheric structures (hemispheric molds 235 filled with material 240) forming the lenses are reached. In a final step J, the planarized layer of material 240 is coated with an optically non-transparent layer 250 and pinholes are provided at the focal point of the lenses to finish the collimation structures. Besides filling the hemispheric molds 235, material 240 additionally forms a spacer layer between the lens and the pinholes as shown in FIG. 6 (spacer layer 140). The provision of a curved surface of material 240 facing the pinholes, for example, by molding can reduce the thickness of the spacer layer. In this case, a further planarization layer has to be provided between the lenses and the pinholes. Alternatively, shapes other than hemispheric molds can be provided by using well-controlled anisotropic etching in step B. The collimation structures can be separated in single collimation structures by dicing. In combination with, for example, a filtered photodiode array, such a collimation structure results in a light sensor in accordance with one embodiment of the invention.

The present invention has been described with reference to particular embodiments and certain drawings, but this is not to be construed in a limiting sense, as the invention is limited only by the appended claims. Any reference signs in the claims shall not be construed as limiting the scope thereof. The drawings described are only schematic and non-limiting. In the drawings, the size of some of the elements may be exaggerated and not drawn to scale for illustrative purposes. Use of the verb "comprise" and its conjugations in the present description and claims does not exclude other elements or steps. Use of an indefinite or definite article when referring to a singular noun, e.g. "a" or "an", "the", includes a plural of this noun unless specifically stated otherwise.

Furthermore, the terms first, second, third and the like in the description and claims are used to distinguish between similar elements and not necessarily to describe a sequential or chronological order. It is to be understood that the terms so used are interchangeable under appropriate circumstances and that the embodiments of the invention described herein are capable of operation in sequences other than those described or illustrated herein.

Moreover, the terms top, bottom, first, second and the like in the description and claims are used for descriptive purposes and not necessarily for describing relative positions. It is to be understood that the terms so used are interchangeable under appropriate circumstances and that the embodiments of the invention described herein are capable of operation in orientations other than those described or illustrated herein.

The invention claimed is:
1. A light sensor for a lighting device, the light sensor comprising
   a light diffuser,
   an optical non-transparent housing having a window forming a light entry aperture, the optical non-transparent housing preventing light entry into the housing except through the window;
   at least one interference filter;
   at least two photo sensors providing a first angle of incidence of light entering the housing with respect to the window and a second angle of incidence of light entering the housing with respect to the window,
   the light diffuser being arranged in such a way that light from outside the optical non-transparent housing passes through the light diffuser so as to enter the interior of the optical non-transparent housing via the window,
   the combination of the light diffuser and the window constituting a substantially Lambertian radiator with a Lambertian ray pattern according to Lambert's cosine law with respect to the surface of the interference filter if light enters the interior of the optical non-transparent housing via the window,
   the interference filter and the at least two photo sensors being arranged in the interior of the optical non-transparent housing to position the at least two photo sensors at said first angle of incidence and the second angle of incidence, the first angle of incidence different than the second angle of incidence,
   said interference filter being arranged between the window and the at least two photo sensors such that the relative intensity of light passing through the window is detectable in at least two different wavelength ranges.

2. The light sensor according to claim 1, comprising an optical non-transparent housing with one interference filter.

3. A lighting device comprising a light sensor according to claim 1, a light source with adaptable color and control electronics, the at least two photo sensors of the light sensor being designed to supply an electric control signal after detecting light passing the at least one interference filter, said control electronics being designed to adapt the color of the light source on the basis of the electric control signal detected by the photo sensors.

4. The lighting device according to claim 3, wherein the light source comprises at least two light-emitting diodes (LEDs) emitting light of different colors.

5. The lighting device according to claim 4, wherein the light diffuser comprises a luminescence converter.

6. The lighting device according to claim 5, wherein the luminescence converter is a monolithic luminescence converter plate having at least one recess, the light sensor being placed in the recess and the window being in contact with the monolithic luminescence converter.

7. A light sensor for integration with a lighting device, comprising an non-transparent housing having a narrow light entry window, the housing preventing light entry into the housing except through the narrow window;

a light diffuser positioned above the window to diffuse the light portion to entry into the housing;

an interference filter opposite the light entry window along a lower portion of the housing;

a first photo sensor opposite the light entry window and positioned at a first angle of incidence with respect to the window;

a second photo sensor opposite the light entry window and positioned at a second angle of incidence with respect to the window;

the first angle of incidence different than the second angle of incidence, the interference filter arranged between the window and the first and second photo sensor such that the relative intensity of light passing through the window is detectable in at least two different wavelength ranges.

* * * * *